United States Patent
Harumoto et al.

(10) Patent No.: US 10,591,820 B2
(45) Date of Patent: Mar. 17, 2020

(54) SUBSTRATE PROCESSING APPARATUS AND SUBSTRATE PROCESSING METHOD

(71) Applicant: SCREEN HOLDINGS CO., LTD., Kyoto (JP)

(72) Inventors: Masahiko Harumoto, Kyoto (JP); Masaya Asai, Kyoto (JP); Yuji Tanaka, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/073,881

(22) PCT Filed: Feb. 3, 2017

(86) PCT No.: PCT/JP2017/004031
§ 371 (c)(1),
(2) Date: Jul. 30, 2018

(87) PCT Pub. No.: WO2017/141736
PCT Pub. Date: Aug. 24, 2017

(65) Prior Publication Data
US 2019/0041754 A1 Feb. 7, 2019

(30) Foreign Application Priority Data

Feb. 17, 2016 (JP) ................................ 2016-028012

(51) Int. Cl.
*G03D 5/00* (2006.01)
*G03F 7/30* (2006.01)
(Continued)

(52) U.S. Cl.
CPC .............. *G03F 7/30* (2013.01); *G03F 7/0042* (2013.01); *G03F 7/0043* (2013.01);
(Continued)

(58) Field of Classification Search
USPC ........................................................ 396/611
See application file for complete search history.

(56) References Cited

U.S. PATENT DOCUMENTS

| | | | | |
|---|---|---|---|---|
| 2001/0037858 A1* | 11/2001 | Taniyama | ......... | H01L 21/67051 156/345.21 |
| 2002/0036183 A1* | 3/2002 | Shibata | ..................... | G03F 7/40 216/44 |

(Continued)

FOREIGN PATENT DOCUMENTS

JP 61-278506 A 12/1986
JP 02-010358 A 1/1990
(Continued)

OTHER PUBLICATIONS

International Search Report dated Apr. 25, 2017 in corresponding PCT International Application No. PCT/JP2017/004031.
(Continued)

*Primary Examiner* — Rodney E Fuller
(74) *Attorney, Agent, or Firm* — Ostrolenk Faber LLP

(57) ABSTRACT

A resist film including a metallic component and a photosensitive material is formed on a surface of a substrate, and then a peripheral portion of the resist film on the substrate is irradiated with light by an edge exposer. Subsequently, development processing is performed with a development liquid from a nozzle on the exposed portion of the resist film. Thus, the part of the resist film formed on the peripheral portion of the substrate is removed. Thereafter, exposure processing is performed on the substrate in an exposure device, so that an exposure pattern is formed on the resist film. Then, a development liquid is supplied to the exposed substrate in a development processing unit, so that development processing is performed on the resist film.

18 Claims, 10 Drawing Sheets

(51) Int. Cl.
*G03F 7/004* (2006.01)
*G03F 7/20* (2006.01)
*G03F 7/16* (2006.01)
*G03F 7/32* (2006.01)
*G03F 7/38* (2006.01)
*H01L 21/027* (2006.01)

(52) U.S. Cl.
CPC .............. *G03F 7/0047* (2013.01); *G03F 7/16* (2013.01); *G03F 7/168* (2013.01); *G03F 7/201* (2013.01); *G03F 7/2028* (2013.01); *G03F 7/3021* (2013.01); *G03F 7/32* (2013.01); *G03F 7/38* (2013.01); *H01L 21/0276* (2013.01)

(56) References Cited

U.S. PATENT DOCUMENTS

| | | |
|---|---|---|
| 2002/0123241 A1 | 9/2002 | Kido |
| 2003/0190534 A1 | 10/2003 | Kobayashi et al. |
| 2007/0183775 A1* | 8/2007 | Mitsuhashi ........... G03F 7/3021 396/611 |
| 2009/0305169 A1 | 12/2009 | Kobayashi |
| 2012/0141944 A1 | 6/2012 | Kobayashi |
| 2012/0315451 A1* | 12/2012 | Malik ...................... C08F 4/06 428/209 |
| 2014/0023776 A1 | 1/2014 | Kuwahara et al. |
| 2014/0065309 A1 | 3/2014 | Kashiyama et al. .......... 427/331 |
| 2014/0170332 A1* | 6/2014 | Iwao ....................... G03F 7/168 427/553 |
| 2018/0088466 A1* | 3/2018 | Kawakami ................ G03F 7/11 |
| 2018/0147599 A1 | 5/2018 | Tanaka et al. |

FOREIGN PATENT DOCUMENTS

| | | |
|---|---|---|
| JP | 06-124887 A | 5/1994 |
| JP | 2002-258486 A | 9/2002 |
| JP | 2004-006765 A | 1/2004 |
| JP | 2009-295716 A | 12/2009 |
| JP | 2013-045864 A | 3/2013 |
| JP | 2014-049463 | 3/2014 |
| JP | 2016-225591 A | 12/2016 |
| TW | 200919092 A | 5/2009 |
| TW | 201409601 A | 3/2014 |
| WO | WO 2016/194285 A1 | 12/2016 |

OTHER PUBLICATIONS

Written Opinion dated Apr. 25, 2017 in corresponding PCT International Application No. PCT/JP2017/004031.
Office Action dated Feb. 23, 2018 in corresponding Taiwanese Patent Application No. 106104127.
Decision to Grant a Patent dated Feb. 4, 2020 in corresponding Japanese Patent Application No. 2016-028012.

\* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2017/004031, filed Feb. 3, 2017, which claims priority to Japanese Patent Application No. 2016-028012, filed Feb. 17, 2016, the contents of both of which are incorporated herein by reference. The PCT International Application was published in the Japanese language.

TECHNICAL FIELD

The present invention relates to a substrate processing apparatus and a substrate processing method for performing processing on a substrate.

BACKGROUND ART

In a lithography process in the manufacture of a semiconductor device or the like, a coating liquid such as a resist liquid is supplied onto a substrate, so that a coating film is formed. For example, the substrate is horizontally held and rotated by a spin chuck. In this state, the resist liquid is discharged to a substantially center portion of an upper surface of the substrate from a resist nozzle, whereby a resist film is formed on the entire upper surface of the substrate as the coating film. Here, if the resist film is present on a peripheral portion of the substrate, when a transport mechanism that transports the substrate grips the peripheral portion of the substrate, part of the resist film is stripped and becomes particles. As such, an organic solvent is discharged to the peripheral portion of the substrate from an edge rinse nozzle, whereby the resist film on the peripheral portion of the substrate is dissolved. Thus, the resist film on the peripheral portion of the substrate is removed (see Patent Document 1, for example).

[Patent Document 1] JP 6-124887 A

SUMMARY OF INVENTION

Technical Problem

In recent years, application of a coating film (hereinafter referred to as a metal-containing coating film) containing metal has been studied in order for finer patterns to be formed. However, according to an experiment conducted by the inventors, it was found that, even in the case where the coating film on the peripheral portion of the substrate was removed by discharge of the organic solvent to the peripheral portion of the metal-containing coating film formed on the substrate, a coating film component including a metallic component was not removed and remained on the peripheral portion of the substrate. Thus, a substrate processing apparatus and an adjacent exposure device are contaminated by the metallic component remaining on the peripheral portion of the substrate.

An object of the present invention is to provide a substrate processing apparatus capable of preventing metallic contamination caused by a metallic component remaining on a peripheral portion of a substrate, and a substrate processing method with which the metallic contamination caused by the metallic component remaining on the peripheral portion of the substrate can be prevented.

Solution to Problem (1) A substrate processing apparatus according to one aspect of the present invention arranged to be adjacent to an exposure device that performs exposure processing on a substrate includes a film formation unit that forms a metal-containing photosensitive film including a metallic component and a photosensitive material on a surface to be processed of the substrate, an edge exposer that irradiates a peripheral portion of the substrate after formation of the metal-containing photosensitive film with light, an edge development processor that performs development processing on a part of the metal-containing photosensitive film that has been irradiated with light by the edge exposer by supplying a development liquid to the peripheral portion of the substrate, a transport mechanism that transports the substrate after the development processing by the edge development processor to the exposure device, and a development processing unit that performs development processing on the metal-containing photosensitive film by supplying a development liquid to the substrate after the exposure processing in the exposure device.

Hereinafter, the exposure processing performed on the metal-containing photosensitive film by the edge exposure processor is referred to as edge exposure processing, and the development processing performed on the metal-containing photosensitive film by the edge development processor is referred to as edge development processing.

In this substrate processing apparatus, after the metal-containing photosensitive film is formed on the surface to be processed of the substrate, the peripheral portion of the substrate is irradiated with light. Thus, the part of the metal-containing photosensitive film on the peripheral portion of the substrate is exposed in the edge exposure processing. Subsequently, the development liquid is supplied to the peripheral portion of the substrate, so that the development processing is performed on the exposed portion of the metal-containing photosensitive film. Thereafter, the substrate is transported to the exposure device. The exposure processing is performed on the substrate in the exposure device, whereby an exposure pattern is formed in the metal-containing photosensitive film, and the development liquid is supplied to the exposed substrate in the development processing unit. Thus, the development processing is performed on the metal-containing photosensitive film.

In this manner, the edge exposure processing and the edge development processing are performed on the part of the metal-containing photosensitive film on the peripheral portion of the substrate after the metal-containing photosensitive film is formed on the substrate and before the substrate is transported to the exposure device. Thus, the metal-containing photosensitive film can be appropriately removed from the peripheral portion of the substrate. Therefore, the metallic component is prevented from remaining on the peripheral portion of the substrate, and the metallic contamination of the substrate processing apparatus and the exposure device is sufficiently prevented.

(2) The film formation unit may include a rotation holder that holds and rotates the substrate, and a liquid supplier that supplies a coating liquid for the metal-containing photosensitive film to the surface to be processed of the substrate rotated by the rotation holder, and the edge exposer may be configured to irradiate the peripheral portion of the substrate rotated by the rotation holder with light after supply of the coating liquid by the liquid supplier.

In this case, the coating liquid for the metal-containing photosensitive film is supplied to the surface to be processed of the substrate by the liquid supplier, and the part of the metal-containing photosensitive film on the peripheral portion of the substrate is irradiated with light by the edge exposer, while the substrate is rotated by the common rotation holder. Thus, the metal-containing photosensitive film can be formed and the edge exposure processing can be performed in the common space. Therefore, an increase in cost of the apparatus and an increase in size of the substrate processing apparatus can be suppressed.

(3) The film formation unit may further include a first removal liquid supplier that supplies a first removal liquid for dissolving the coating liquid to the peripheral portion of the substrate rotated by the rotation holder after supply of the coating liquid by the liquid supplier.

In this case, the first removal liquid is supplied to the peripheral portion of the substrate, whereby the metal-containing photosensitive film is more sufficiently removed from the peripheral portion of the substrate. Therefore, the metallic component is more sufficiently prevented from remaining on the peripheral portion of the substrate.

(4) The edge development processor may be configured to discharge the development liquid to the peripheral portion of the substrate that is rotated by the rotation holder after irradiation with light by the edge exposer. In this case, the edge development processing can be performed in the common space in addition to the formation of the metal-containing photosensitive film and the edge exposure processing. Thus, an increase in cost of the apparatus and an increase in size of the substrate processing apparatus can further be suppressed. Further, after the metal-containing photosensitive film is formed, it is possible to remove the part of the metal-containing photosensitive film on the peripheral portion of the substrate without transporting the substrate from the rotation holder. Therefore, the metallic component is prevented from spreading during transportation of the substrate, and the metallic contamination is more sufficiently prevented.

(5) The substrate processing apparatus may further include a heater configured to heat the peripheral portion of the substrate rotated by the rotation holder after irradiation with light by the edge exposer and before the development processing by the edge development processor.

In this case, the peripheral portion of the substrate is heated after the edge exposure processing, whereby catalysis of a product (acid) that is produced by the edge exposure processing can be promoted, and solubility of the metal-containing photosensitive film in the development liquid can be enhanced. Thus, an amount of light with which the peripheral portion of the substrate is irradiated in the edge exposure processing can be reduced, and the throughput of the edge exposure processing can be improved.

(6) The edge development processor may be provided in the development processing unit. In this case, in the common development processing unit, the edge development processing and the normal development processing can be respectively performed on the metal-containing photosensitive film. Thus, an increase in cost of the apparatus and an increase in size of the substrate processing apparatus can be suppressed.

(7) The edge development processor and the development processing unit may have a common development liquid nozzle that can discharge the development liquid. In this case, the edge development processing and the normal development processing can be respectively performed with use of the common development processing nozzle. Thus, the cost of the apparatus can further be lowered.

(8) The substrate processing apparatus may further include a thermal processing unit that performs heating processing on the substrate after irradiation with light by the edge exposer and before development by the edge development processor. In this case, the heating processing for the substrate before exposure by the exposure device, and the heating processing for the peripheral portion of the substrate after the edge exposure processing can be simultaneously performed in the thermal processing unit. Thus, a time period required to process the substrate can be shortened.

(9) The substrate processing apparatus may further include a second removal liquid supplier that supplies a second removal liquid for dissolving a metallic component to the peripheral portion of the substrate after the development processing by the edge development processor. In this case, the metallic component can be more sufficiently prevented from remaining on the peripheral portion of the substrate.

(10) A substrate processing method according to another aspect of the present invention includes the steps of forming a metal-containing photosensitive film including a metallic component and a photosensitive material on a surface to be processed of a substrate by a film formation unit, irradiating a peripheral portion of the substrate after formation of the metal-containing photosensitive film with light by an edge exposer, performing development processing on a part of the metal-containing photosensitive film that has been irradiated with light by the edge exposer by supplying a development liquid to the peripheral portion of the substrate by an edge development processor, transporting the substrate after the development processing by the edge development processor to an exposure device, and performing development processing on the metal-containing photosensitive film by supplying a development liquid to the substrate in a development processing unit after exposure processing in the exposure device.

With this substrate processing method, the peripheral portion of the substrate is irradiated with light after the metal-containing photosensitive film is formed on the surface to be processed of the substrate. Thus, the part of the metal-containing photosensitive film on the peripheral portion of the substrate is exposed. Subsequently, the development liquid is supplied to the peripheral portion of the substrate, whereby the development processing is performed on the exposed portion of the metal-containing photosensitive film. Thereafter, the substrate is transported to the exposure device. The exposure processing is performed on the substrate in the exposure device, whereby the exposure pattern is formed on the metal-containing photosensitive film, and the development liquid is subsequently supplied to the exposed substrate in the development processing unit. Thus, the development processing is performed on the metal-containing photosensitive film.

In this manner, the exposure processing and the development processing are performed on the part of the metal-containing photosensitive film on the peripheral portion of the substrate after the metal-containing photosensitive film is formed on the substrate and before the substrate is transported to the exposure device. Thus, the metal-containing photosensitive film can be appropriately removed from the peripheral portion of the substrate. Therefore, the metallic component is prevented from remaining on the peripheral portion of the substrate, and the metallic contamination of the substrate processing apparatus and the exposure device is sufficiently prevented.

(11) The step of forming the metal-containing photosensitive film may include supplying a coating liquid for the metal-containing photosensitive film by a liquid supplier to the surface to be processed of the substrate rotated by a rotation holder, and the step of irradiating the peripheral portion of the substrate with light may include irradiating the peripheral portion of the substrate rotated by the rotation holder with light by the edge exposer after supply of the coating liquid by the liquid supplier.

In this case, the coating liquid for the metal-containing photosensitive film is supplied to the surface to be processed of the substrate by the liquid supplier, and the part of the metal-containing photosensitive film on the peripheral portion of the substrate is irradiated with light by the edge exposure unit, while the substrate is rotated by the common rotation holder. Thus, the metal-containing photosensitive film can be formed and the edge exposure processing can be performed in the common space. Therefore, an increase in cost of the apparatus and an increase in size of the substrate processing apparatus can be suppressed.

Advantageous Effects of Invention

The present invention can prevent the metallic contamination caused by the metallic component remaining on the peripheral portion of the substrate.

DESCRIPTION OF EMBODIMENTS

A substrate processing apparatus and a substrate processing method according to embodiments of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like. Further, as for the substrate used in the present embodiment, at least part of the substrate has a circular outer periphery. The outer periphery excluding a notch for positioning is circular, for example.

[1] First Embodiment (1) Substrate Processing Apparatus

Figure 1:
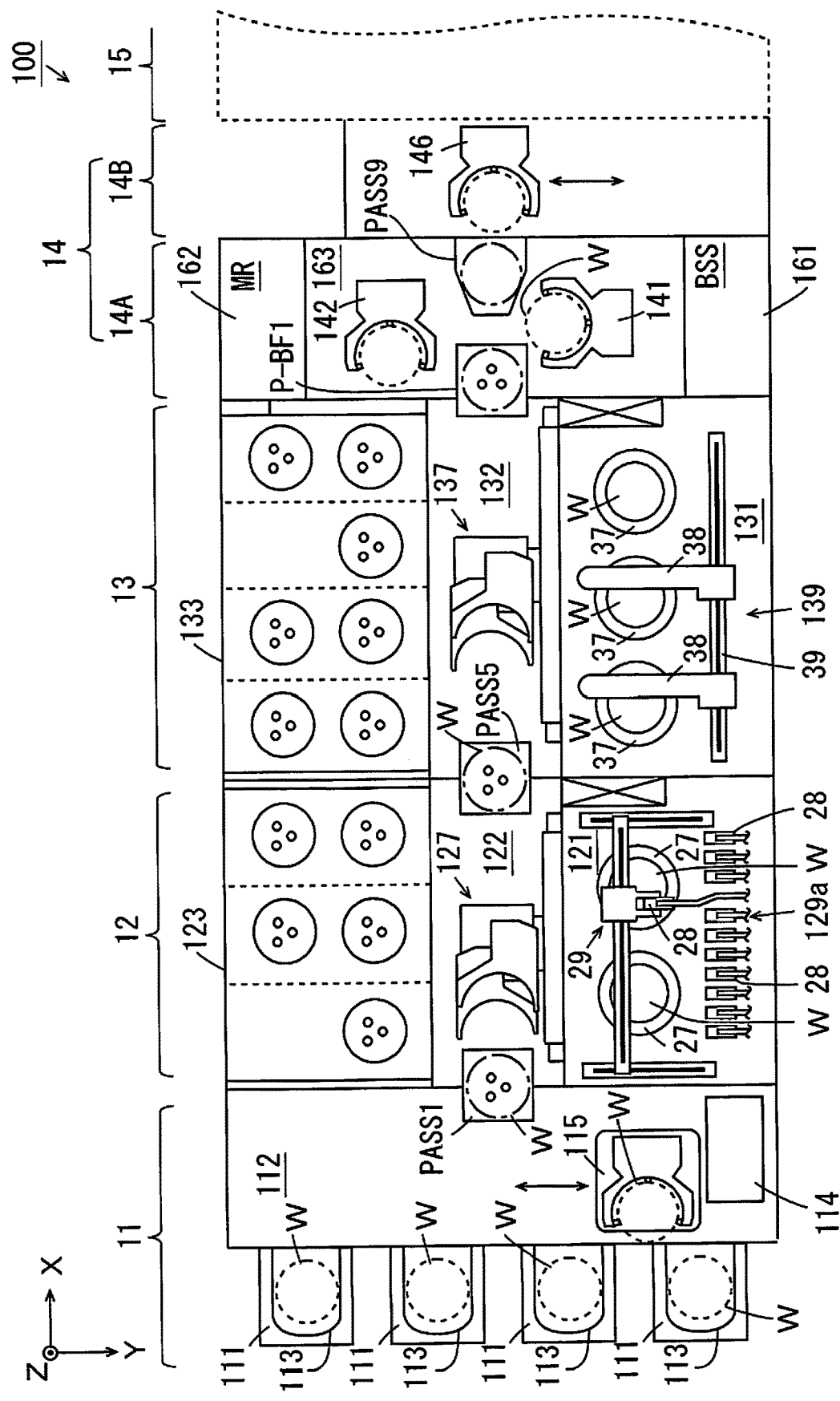
FIG. 1 is a schematic plan view of a substrate processing apparatus according to a first embodiment of the present invention.

FIG. 1 is a schematic plan view of the substrate processing apparatus according to the first embodiment of the present invention. FIG. 1 and the subsequent drawings are accompanied by arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the present example, the exposure device 15 performs exposure processing on the substrate W using EUV (Extreme Ultra Violet) having a wavelength of not less than 13 nm and not more than 14 nm, for example. Hereinafter, the exposure processing performed on the substrate W by the exposure device 15 is referred to as normal exposure processing.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 holds and transports the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 9) on which the substrates W are placed are provided between the transport section 122 and the indexer block 11. Transport mechanisms 127, 128 (see FIG. 9) for transporting the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 9) on which the substrates W are placed are provided between the transport section 132 and the transport section 122. Transport mechanisms 137, 138 (see FIG. 9) for transporting the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 9) are provided between the transport section 163 and the transport section 132. Each of the placement buffer units P-BF1, P-BF2 is configured to be able to store a plurality of substrates W.

Further, a substrate platform PASS9 and below-mentioned placement cooling units P-CP (see FIG. 9) are provided to be adjacent to the carry-in carry-out block 14B between the transport mechanisms 141, 142. The placement cooling units P-CP include a function of cooling the substrates W (cooling plates, for example). In the placement cooling units P-CP, the substrates W are cooled to a temperature suitable for the exposure processing. A transport mechanism 146 is provided in the carry-in carry-out block 14B. The transport mechanism 146 carries in the substrate W to and carries out the substrate W from the exposure device 15.

Figure 2:
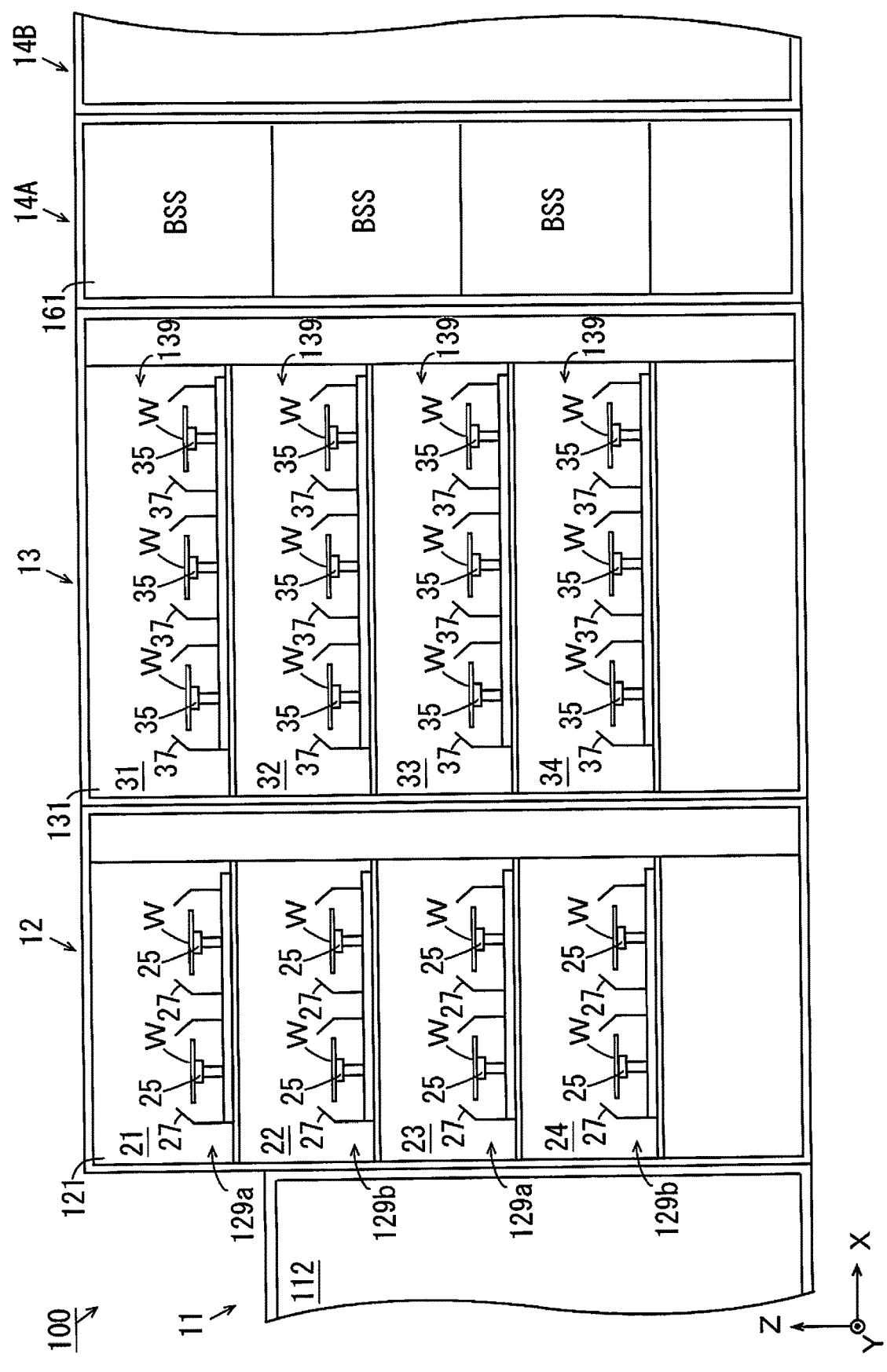
FIG. 2 is a schematic side view showing inner configurations of a coating processing section, a development processing section and a cleaning drying processing section of FIG. 1.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, the coating processing section 121 has coating processing chambers 21, 22, 23, 24 provided in a stack. Each of the coating processing chambers 21, 23 is provided with a resist film coating processing unit 129a for forming a resist film on the substrate W. Each of the coating processing chambers 22, 24 is provided with an anti-reflection film coating processing unit 129b for forming an anti-reflection film on the substrate W. The development processing section 131 has development processing chambers 31 to 34 provided in a stack. Each of the development processing chambers 31 to 34 is provided with a development processing unit 139.

Figure 3:
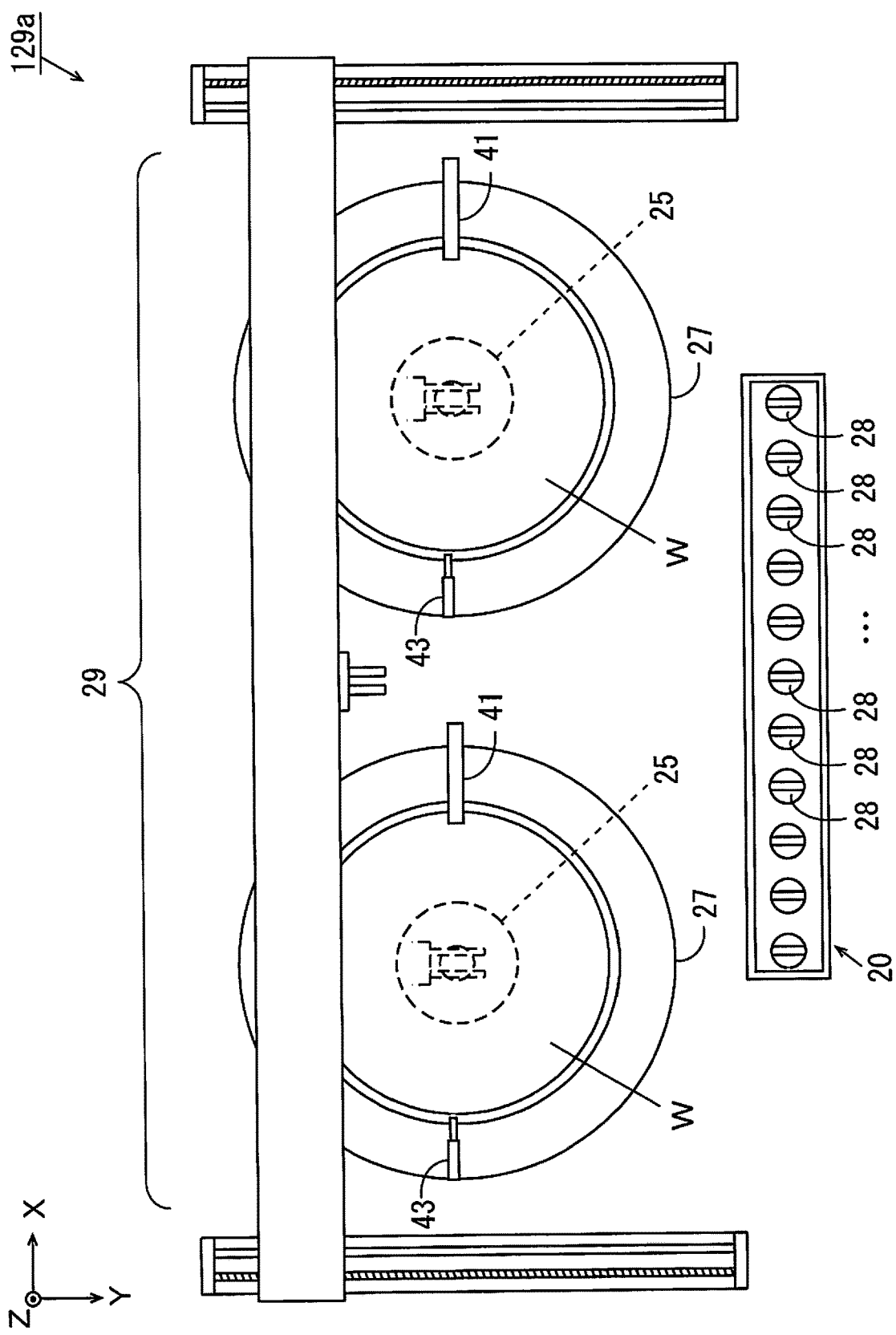
FIG. 3 is a schematic plan view showing a configuration of a resist film coating processing unit.
Figure 4:
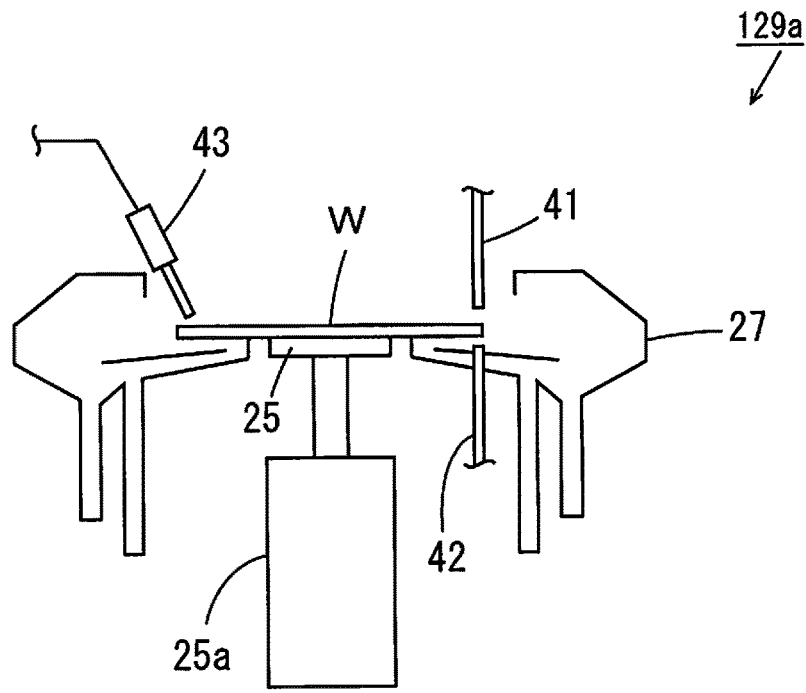
FIG. 4 is a schematic side view showing a partial configuration of the resist film coating processing unit.

FIG. 3 is a schematic plan view showing a configuration of the resist film coating processing unit 129a. FIG. 4 is a schematic side view showing a partial configuration of the resist film coating processing unit 129a. As shown in FIG. 3, the resist film coating processing unit 129a includes a waiting section 20, a plurality of spin chucks 25, a plurality of cups 27, a plurality of coating liquid nozzles 28, a nozzle transport mechanism 29, a plurality of edge exposure units 41 and a plurality of development liquid nozzles 43. In the present embodiment, two spin chucks 25 are provided in the resist film coating processing unit 129a. A cup 27, an edge exposure unit 41 and a development liquid nozzle 43 are provided for each spin chuck 25. Further, as shown in FIG. 4, a heater 42 is provided in the resist film coating processing unit 129a for each spin chuck 25. In FIG. 4, only the parts relating to one spin chuck 25 is shown.

Each spin chuck 25 is driven to be rotated by a driving device 25a (FIG. 4) made of an electrical motor or the like while holding the substrate W. The cup 27 is provided to surround the spin chuck 25. During the waiting, each coating liquid nozzle 28 of FIG. 3 is inserted into the waiting section 20. A coating liquid for a resist film (hereinafter referred to as a resist liquid) that includes a metallic component and a photosensitive material, described below, is supplied from a coating liquid storage (not shown) to each coating liquid nozzle 28. In the present embodiment, the resist liquid for positive tone development is used.

Any one of the plurality of coating liquid nozzles 28 is moved to a position above the substrate W by the nozzle transport mechanism 29. The resist liquid is discharged from a coating liquid nozzle 28 while the spin chuck 25 rotates, whereby the resist liquid is applied onto the rotating substrate W. Thus, the resist film is formed on a surface to be processed of the substrate W. Here, the surface to be processed refers to the surface of the substrate W on which any types of patterns such as a circuit pattern is formed.

A metallic component such as metallic molecules or metallic oxide for performing the substrate processing with high accuracy is contained in the resist liquid as a composition. In the present example, Sn (tin), $HfO_2$ (hafnium oxide) or $ZrO_2$ (zirconium dioxide), for example, is contained in the resist liquid as the metallic component.

The edge exposure unit 41 is made of optical fibers, for example, and irradiates a peripheral portion of the surface to be processed of the substrate W held by the spin chuck 25 with light for the exposure processing (hereinafter referred to as exposure light). The exposure light is ultraviolet rays, for example. Here, the peripheral portion of the substrate W refers to the region, having a constant width and extending along an outer periphery of the substrate W.

After the resist film is formed on the substrate W, the peripheral portion of the surface to be processed of the substrate W is irradiated with the exposure light by the edge exposure unit 41 with the substrate W rotated by the spin chuck 25. Thus, the exposure processing (hereinafter referred to as edge exposure processing) is performed on the part of the resist film formed on the peripheral portion of the substrate W.

As shown in FIG. 4, the heater 42 is provided below the peripheral portion of the substrate W held by the spin chuck 25. The heater 42 is made of optical fibers, for example, and irradiates the peripheral portion of the substrate W held by the spin chuck 25 with the light for heating processing (hereinafter referred to as heating light). The heating light is infrared rays, for example.

After the above-mentioned edge exposure processing, the peripheral portion of the substrate W is irradiated with the heating light by the heater 42 with the substrate W rotated by the spin chuck 25. Thus, post-exposure heating processing (hereinafter referred to as edge heating processing) is performed on the part of the resist film formed on the peripheral portion of the substrate W. Catalysis of a product (acid) produced by the photochemical reaction during the edge exposure processing can be promoted by the edge heating processing, and solubility of the resist film in a development liquid can be enhanced. Thus, an amount of light with which the peripheral portion of the substrate W is irradiated in the edge exposure processing can be reduced, and the throughput of the edge exposure processing can be improved.

A development liquid nozzle 43 is arranged to be directed to the peripheral portion of the surface to be processed of the substrate W held by the spin chuck 25. A development liquid is supplied from a development liquid storage (not shown) to the development liquid nozzle 43. An alkaline aqueous solution can be used as a development liquid for positive tone development processing. The alkaline aqueous solution includes TMAH (tetra methyl ammonium hydroxide) or KOH (potassium hydroxide), for example.

After the above-mentioned edge exposure processing, the development liquid is supplied to the peripheral portion of the surface to be processed of the substrate W from the development liquid nozzle 43 with the substrate W rotated by the spin chuck 25. Thus, the development processing (hereinafter referred to as edge development processing) is performed on the part of the resist film formed on the peripheral portion of the substrate W. Specifically, the peripheral portion of the resist film that has been exposed in the edge exposure processing and has been heated in the edge heating processing is dissolved in the development liquid and removed.

In this manner, after the resist film is formed on the substrate W, the edge exposure processing, the edge heating processing and the edge development processing are sequentially performed in the resist film coating processing unit 129a. Thus, the part of the resist film formed on the peripheral portion of the substrate W is removed.

A rinse liquid nozzle for supplying a rinse liquid (pure water, for example) to the peripheral portion of the substrate W after the edge development processing may further be provided. In this case, the rinse liquid nozzle supplies the rinse liquid to the peripheral portion of the substrate W, whereby the development liquid and residues of the resist film that has been dissolved in the development liquid can be cleaned away from the peripheral portion of the substrate W.

Figure 5:
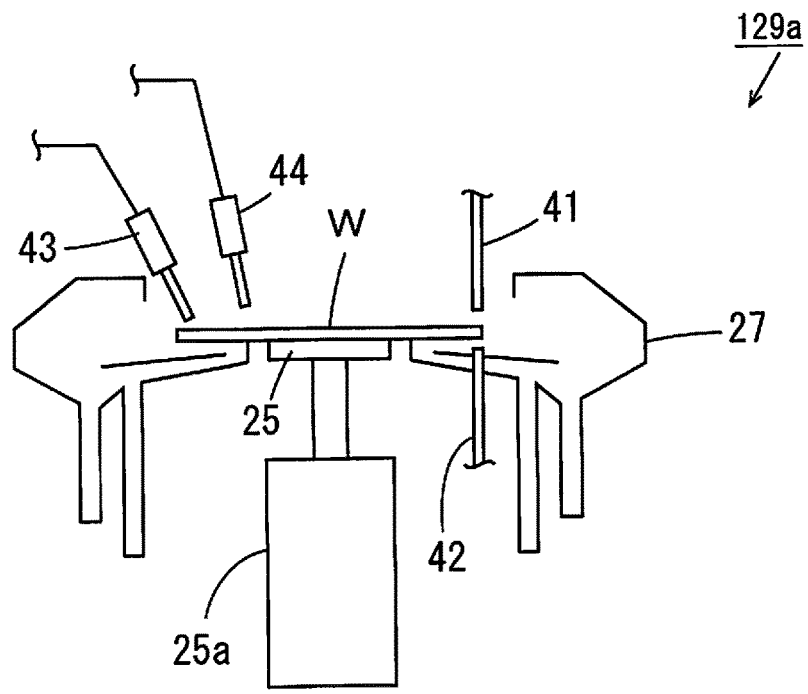
FIG. 5 is a diagram showing another example of a configuration of a resist film coating processing unit.

FIG. 5 is a diagram showing another example of a configuration of a resist film coating processing unit 129a. As for the example of FIG. 5, a difference from the example of FIGS. 3 and 4 will be described. The resist film coating processing unit 129a of FIG. 5 further includes an edge rinse nozzle 44.

The edge rinse nozzle 44 is arranged to be directed to a peripheral portion of a surface to be processed of the substrate W held by a spin chuck 25. The edge rinse nozzle 44 is provided to be able to discharge a removal liquid having organic nature (hereinafter referred to as an organic removal liquid). The organic removal liquid includes an organic solvent such as a thinner, butyl acetate, PGMEA (propyleneglycol monomethyl ether acetate) or PGME (propyleneglycol monomethyl ether).

In the resist film coating processing unit 129a of FIG. 5, after a resist film is formed on the substrate W, and before the above-mentioned edge exposure processing is performed, the organic removal liquid is supplied to the peripheral portion of the surface to be processed of the substrate W from the edge rinse nozzle 44 while the substrate W is rotated by the spin chuck 25. Thus, a large part of the resist film on the peripheral portion of the substrate W is dissolved and removed. Thereafter, the edge exposure processing, the edge heating processing and the edge development processing, described above, are sequentially performed. Thus, even when residues of the resist film adheres to the peripheral portion of the substrate W after the organic removal liquid is supplied, the residues of the resist film can be removed by the subsequent edge exposure processing, the subsequent edge heating processing and the subsequent edge development processing.

In addition to the edge rinse nozzle 44, a back rinse nozzle that can discharge the organic removal liquid to a back surface of the substrate W may be provided. Here, the back surface refers to the surface opposite to the surface to be processed of the substrate W. In this case, even when a resist liquid adheres to the back surface of the substrate W, the resist liquid can be removed from the back surface of the substrate W by the organic removal liquid discharged from the back rinse nozzle. Further, a development liquid nozzle 43 may be able to selectively discharge a development liquid and the organic removal liquid. In this case, because the edge rinse nozzle 44 becomes unnecessary, space saving can be achieved in the resist film coating processing unit 129a.

The anti-reflection coating processing unit 129b provided in each of the coating processing chambers 22, 24 of FIG. 2 has a configuration similar to that of the resist film coating processing unit 129a of FIGS. 3 and 4, or that of the resist film coating processing unit 129a of FIG. 5 except that the edge exposure unit 41, the heater 42 and the development liquid nozzle 43 are not included. A coating liquid for the anti-reflection film is supplied to a coating liquid nozzle 28 of the anti-reflection film coating processing unit 129b, and the coating liquid is supplied onto the substrate W. Thus, an anti-reflection film is formed on the surface to be processed of the substrate W. A metallic component may be contained in the coating liquid supplied to the substrate W in the anti-reflection film coating processing unit 129b. In this case, the metallic component similar to the metallic component contained in the resist liquid is used.

As shown in FIG. 2, similarly to each resist film coating processing unit 129a, each development processing unit 139 includes a plurality of spin chucks 35 and a plurality of cups 37. Further, as shown in FIG. 1, the development processing unit 139 includes two slit nozzles 38 that discharge a development liquid and a movement mechanism 39 that moves these slit nozzles 38 in the X direction.

In the development processing unit 139, each spin chuck 35 is rotated by a driving device (not shown). Thus, the substrate W is rotated. In this state, the development liquid is supplied to each substrate W while a slit nozzle 38 is moved. Thus, the development processing is performed on the substrate W. In the development processing unit 139, the development processing is performed on the substrate W after the normal exposure processing by the exposure device 15 of FIG. 1. Hereinafter, the development processing performed in the development processing unit 139 after the normal exposure processing is referred to as normal development processing.

A plurality (three in the present example) of cleaning drying processing units BSS are provided in the cleaning drying processing section 161. In each cleaning drying processing unit BSS, the peripheral portion and the back surface of the substrate W are cleaned with use of an organic solvent or pure water and dried before the normal exposure processing.

(3) Thermal Processing Sections

Figure 6:
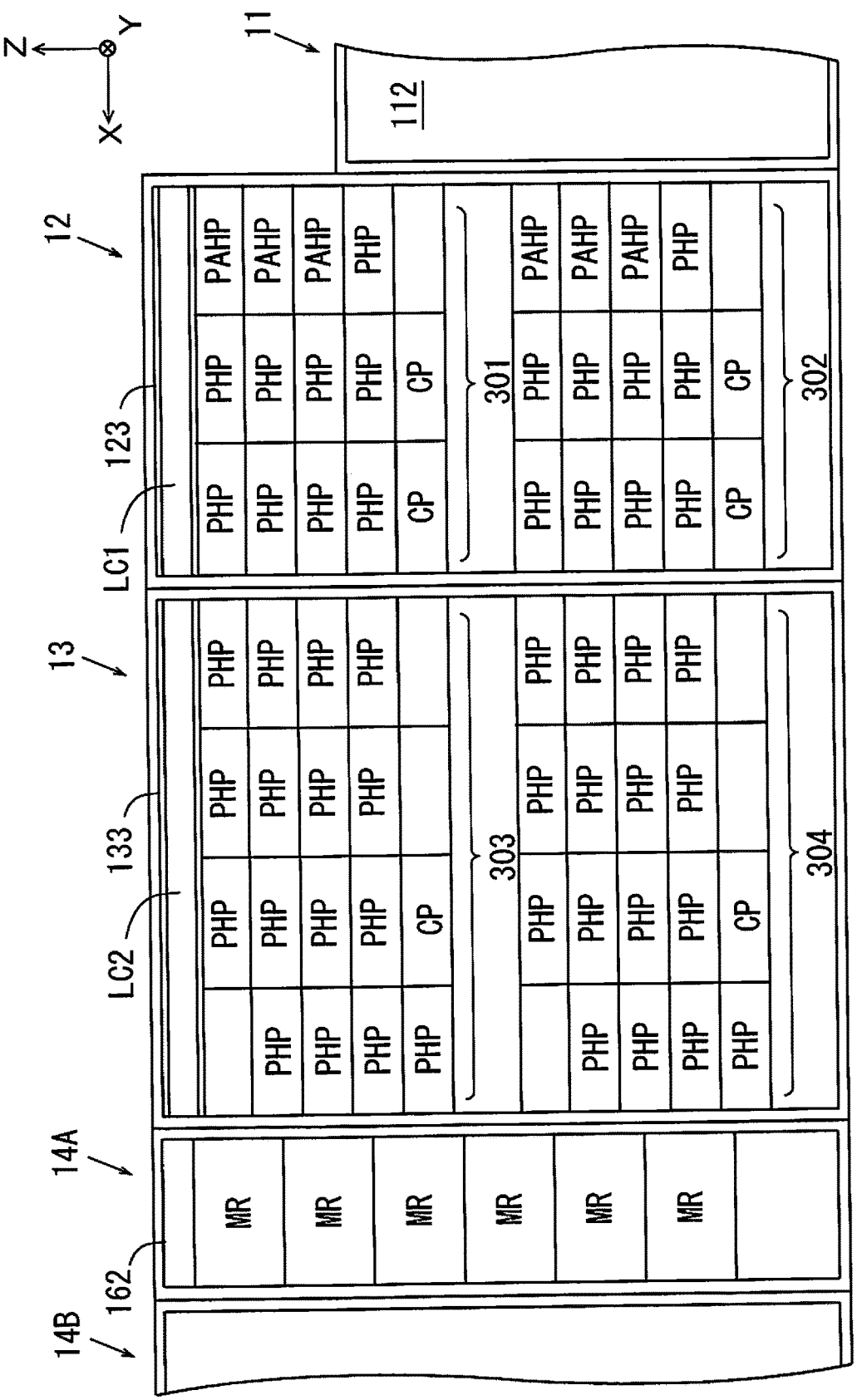
FIG. 6 is a schematic side view showing inner configurations of thermal processing sections and a cleaning drying processing section of FIG. 1.

FIG. 6 is a schematic side view showing inner configurations of the thermal processing sections 123, 133 and the cleaning drying processing section 162 of FIG. 1. As shown in FIG. 6, the thermal processing section 123 has an upper thermal processing section 301 provided above and a lower thermal processing section 302 provided below. A plurality of thermal processing units PHP, a plurality of adhesion reinforcement processing units PAHP and a plurality of cooling units CP are provided in each of the upper thermal processing section 301 and the lower thermal processing section 302.

A local controller LC1 is provided in a top portion of the thermal processing section 123. The local controller LC1 controls operations of the coating processing section 121, the transport section 122 and the thermal processing section 123 based on instructions from the main controller 114 of FIG. 1.

Heating processing and cooling processing are performed on the substrate W in each thermal processing unit PHP. Adhesion reinforcement processing for improving adhesion between the substrate W and the anti-reflection film is performed in each adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, the cooling processing is performed on the substrate W.

The thermal processing section 133 has an upper thermal processing section 303 provided above and a lower thermal processing section 304 provided below. A cooling unit CP and a plurality of thermal processing units PHP are provided in each of the upper thermal processing section 303 and the lower thermal processing section 304.

A local controller LC2 is provided in a top portion of the thermal processing section 133. The local controller LC2 controls operations of the development processing section 131, the transport section 132 and the thermal processing section 133 based on instructions from the main controller 114 of FIG. 1.

(4) Metal Removal Units

Figure 7:
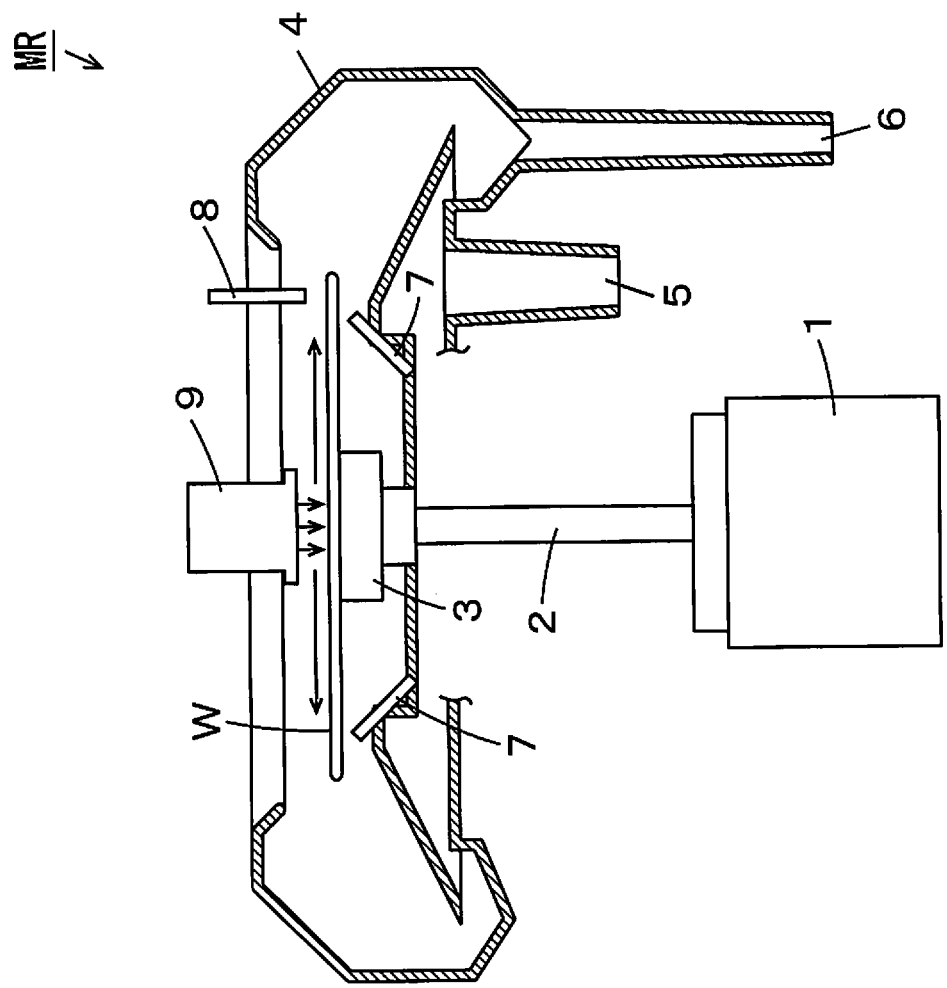
FIG. 7 is a schematic diagram for explaining a configuration of a metal removal unit.

A plurality (six in the present example) of metal removal units MR are provided in the cleaning drying processing section 162. FIG. 7 is a schematic diagram for explaining a configuration of each metal removal unit MR. As shown in FIG. 7, a motor 1, a spin chuck 3, a cup 4, two back surface cleaning nozzles 7, a peripheral portion cleaning nozzle 8 and a gas supplier 9 are provided in the metal removal unit MR. The spin chuck 3 is attached to the upper end of a rotation shaft 2 of the motor 1 to be rotatable about a vertical axis. The cup 4 is arranged to surround the substrate W held by the spin chuck 3. A liquid drainage port 5 and a gas exhaust port 6 are formed in lower portions of the cup 4.

The two back surface cleaning nozzles 7 are arranged to be directed to the back surface of the substrate W held by the spin chuck 3. A removal liquid that can dissolve a metallic component (hereinafter referred to as a metal removal liquid) is discharged to the back surface of the substrate W from the back surface cleaning nozzles 7. The peripheral portion cleaning nozzle 8 is arranged to be directed to the peripheral portion of the substrate W held by the spin chuck 3. The metal removal liquid is discharged to the peripheral portion of the surface to be processed of the substrate W from the peripheral portion cleaning nozzle 8.

An alkaline removal liquid or an acid removal liquid is used as the metal removal liquid. The alkaline removal liquid is an aqueous solution including ammonia and hydrogen peroxide, for example. The alkaline removal liquid may be TMAH, for example. The acid removal liquid is an aqueous solution including diluted hydrofluoric acid, for example. The acid removal liquid may be an aqueous solution including sulfuric acid and hydrogen peroxide, or an aqueous solution including acetic acid or a chelating agent. The chelating agent includes one type or a plurality of types selected from a group including an organic acid, an organic acid salt, an amino acid, an amino acid derivative, inorganic alkali, an inorganic alkali salt, an alkylamine, an alkylamine derivative, an alkanolamine and an alkanolamine derivative.

The gas supplier 9 is arranged above substantially the center portion of the substrate W held by the spin chuck 3. An inert gas, for example, a nitrogen gas, is ejected to substantially the center portion of the surface to be processed of the substrate W from the gas supplier 9. In this case, the gas ejected from the gas supplier 9 is diffused around substantially the center portion of the surface to be processed of the substrate W. Thus, the metal removal liquid discharged from the peripheral portion cleaning nozzle 8 is prevented from adhering to the resist film formed on the surface to be processed of the substrate W.

In this manner, the metal removal liquid is supplied to the peripheral portion and the back surface of the substrate W in the metal removal unit MR. Thus, even when a metallic component remains on the peripheral portion and the back surface of the substrate W after the above-mentioned edge development processing, the metallic component can be dissolved and removed. Therefore, the inside of the substrate processing apparatus 100 and the inside of the exposure device 15 are sufficiently prevented from being contaminated by the metallic component.

In the plurality of metal removal units MR, the common metal removal liquid may be used, or different types of metal removal liquids may be used. For example, the metal removal liquid used in the three metal removal units MR out of the six metal removal units MR may be different from the metal removal liquid used in the remaining three metal removal units MR. In this case, a metallic component adhering to the peripheral portion and the back surface of the substrate W can be removed by a suitable metal removal unit MR according to the type of a metallic component contained in the resist film.

Figure 8:
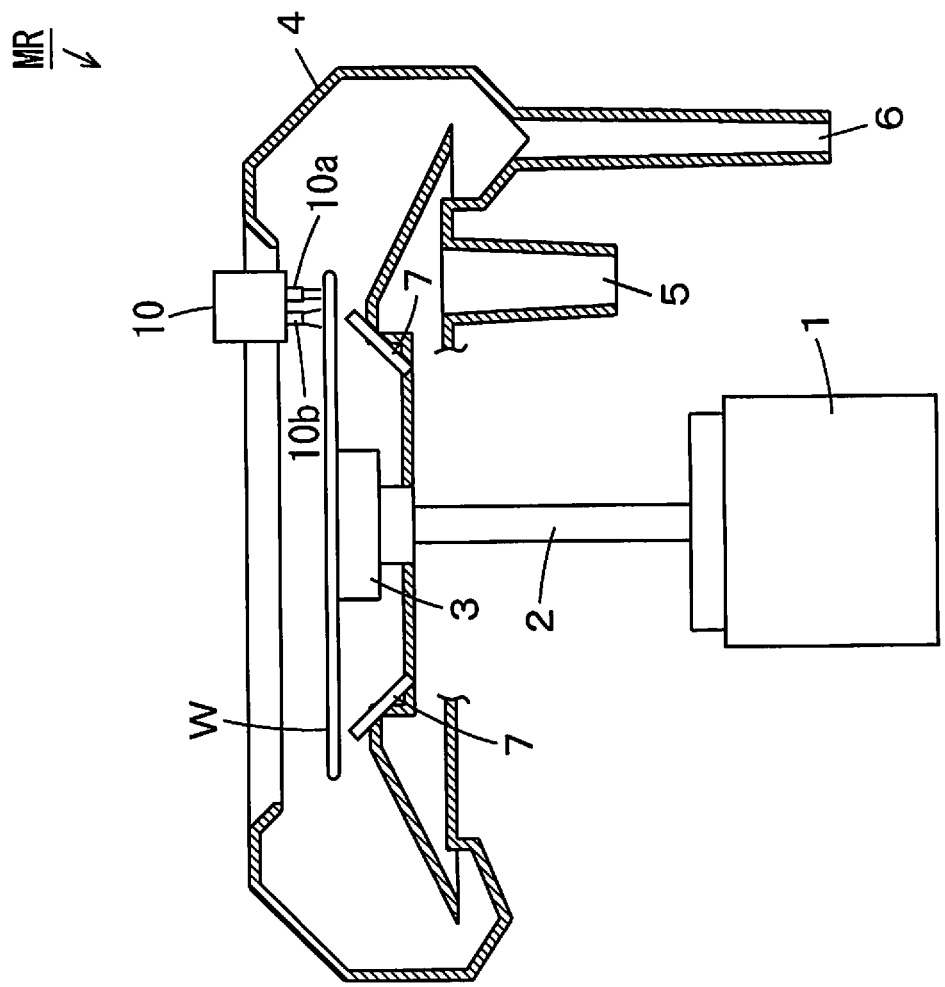
FIG. 8 is a diagram showing another configuration of a metal removal unit.

FIG. 8 is a diagram showing another configuration of a metal removal unit MR. A gas liquid supply nozzle 10 is provided in the metal removal unit MR of FIG. 8 instead of the peripheral portion cleaning nozzle 8 and the gas supplier 9 of FIG. 7. The gas liquid nozzle 10 includes a liquid nozzle 10a and a gas nozzle 10b arranged in a horizontal direction. The gas liquid supply nozzle 10 is arranged to be directed to a peripheral portion of a substrate W held by the spin chuck 3. Here, the gas nozzle 10b is positioned closer to the center of the substrate W than the liquid nozzle 10a.

A metal removal liquid is discharged from the liquid nozzle 10a to the peripheral portion of the substrate W. An inert gas, for example, a nitrogen gas, is ejected to the peripheral portion of the substrate W from the gas nozzle 10b. In this case, the position of the substrate W to which the gas is ejected from the gas nozzle 10b is closer to the center of the substrate W than the position to which the metal removal liquid is discharged from the liquid nozzle 10a. Therefore, the metal removal liquid discharged from the liquid nozzle 10a is prevented from moving towards the center of the substrate W by the gas ejected from the gas nozzle 10b. Thus, the metal removal liquid discharged from the liquid nozzle 10a is prevented from adhering to a resist film formed on a surface to be processed of the substrate W.

Further, because a substrate W is transported after curing of a resist film by the thermal processing section 123 to each of the metal removal units MR of FIGS. 7 and 8, even when the gas is discharged from the gas supplier 9 or the gas nozzle 10b, the film thickness of the resist film is not affected. As a result, the resist film having a uniform thickness can be formed on a surface to be processed of the substrate W.

(5) Transport Sections

Figure 9:
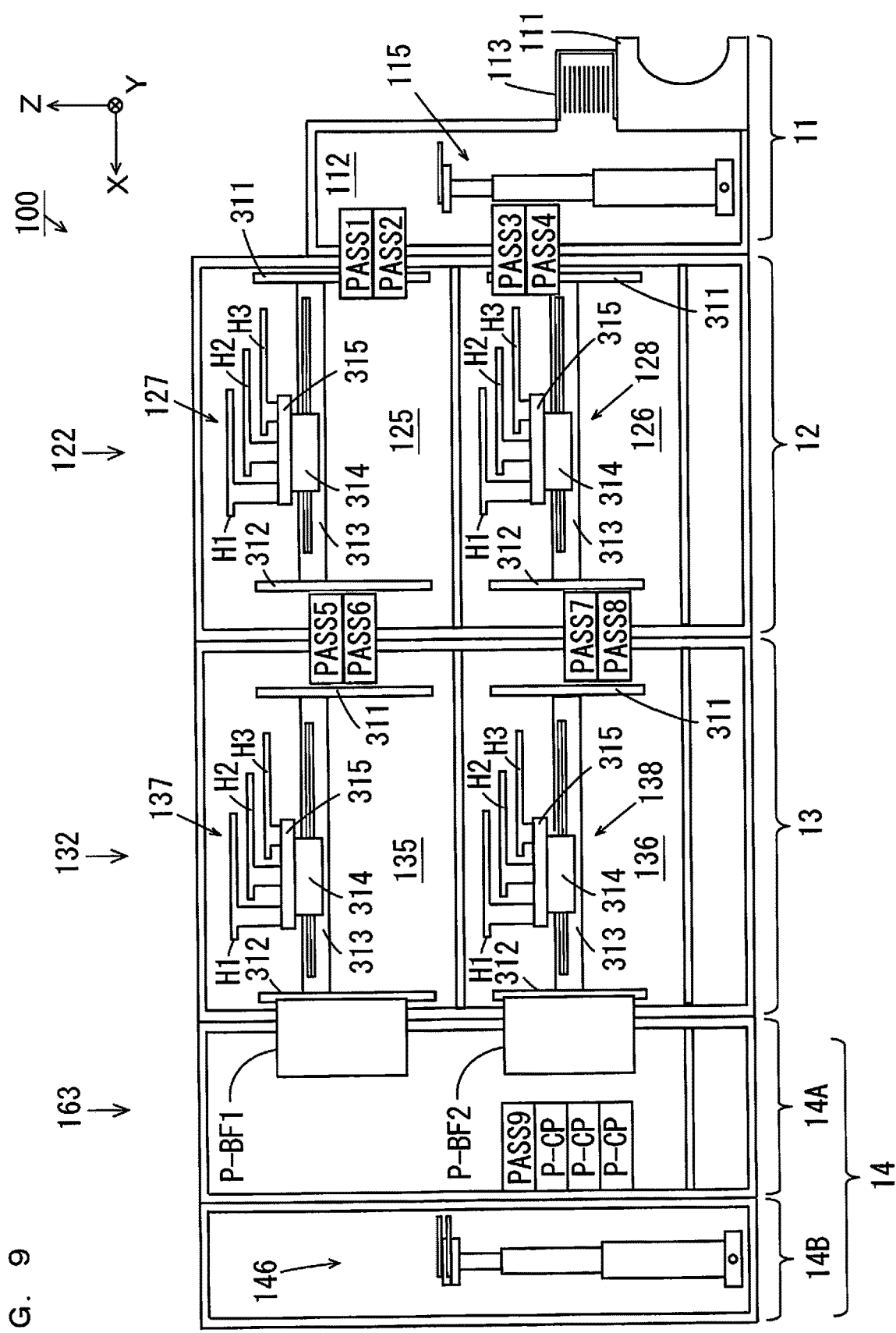
FIG. 9 is a schematic side view showing inner configurations of transport sections.

FIG. 9 is a schematic side view showing inner configurations of the transport sections 122, 132, 163. As shown in FIG. 9, the transport section 122 has an upper transport chamber 125 and a lower transport chamber 126. The transport section 132 has an upper transport chamber 135 and a lower transport chamber 136. The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

The coating processing chambers 21, 22 (FIG. 2) are opposite to the upper thermal processing section 301 (FIG. 6) with the upper transport chamber 125 interposed therebetween. The coating processing chambers 23, 24 (FIG. 2) are opposite to the lower thermal processing section 302 (FIG. 6) with the lower transport chamber 126 interposed therebetween. Similarly, the development processing chambers 31, 32 (FIG. 2) are opposite to the upper thermal processing section 303 (FIG. 6) with the upper transport chamber 135 interposed therebetween. The development processing chambers 33, 34 (FIG. 2) are opposite to the lower thermal processing section 304 (FIG. 6) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9 and the plurality of placement cooling units P-CP are provided in the transport section 163 to be adjacent to the carry-in carry-out block 14B.

The placement buffer unit P-BF1 is configured such that the substrates W can be carried into and carried out from the placement buffer unit P-BF1 by the transport mechanisms 137 and the transport mechanisms 141, 142 (FIG. 1). The placement buffer unit P-BF2 is configured such that the substrates W can be carried into and carried out from the placement buffer unit P-BF2 by the transport mechanism 138 and the transport mechanisms 141, 142 (FIG. 1). Further, the substrate platform PASS9 and the placement cooling units P-CP are configured such that the substrates W can be carried into and carried out from the substrate platform PASS9 and the placement cooling units P-CP by the transport mechanisms 141, 142 (FIG. 1) and the transport mechanism 146.

The substrates W to be transported from the indexer block 11 to the first processing block 12 are placed on the substrate platform PASS1 and the substrate platform PASS3. The substrates W to be transported from the first processing block 12 to the indexer block 11 are placed on the substrate platform PASS2 and the substrate platform PASS4.

The substrates W to be transported from the first processing block 12 to the second processing block 13 are placed on the substrate platform PASS5 and the substrate platform PASS7. The substrates W to be transported from the second processing block 13 to the first processing block 12 are placed on the substrate platform PASS6 and the substrate platform PASS8.

The substrates W to be transported from the second processing block 13 to the cleaning drying processing block 14A are placed on the placement buffer units P-BF1, P-BF2. The substrates W to be transported from the cleaning drying processing block 14A to the carry-in carry-out block 14B are placed on the placement cooling units P-CP. The substrate W to be transported from the carry-in carry-out block 14B to the cleaning drying processing block 14A is placed on the substrate platform PASS9.

Figure 10:
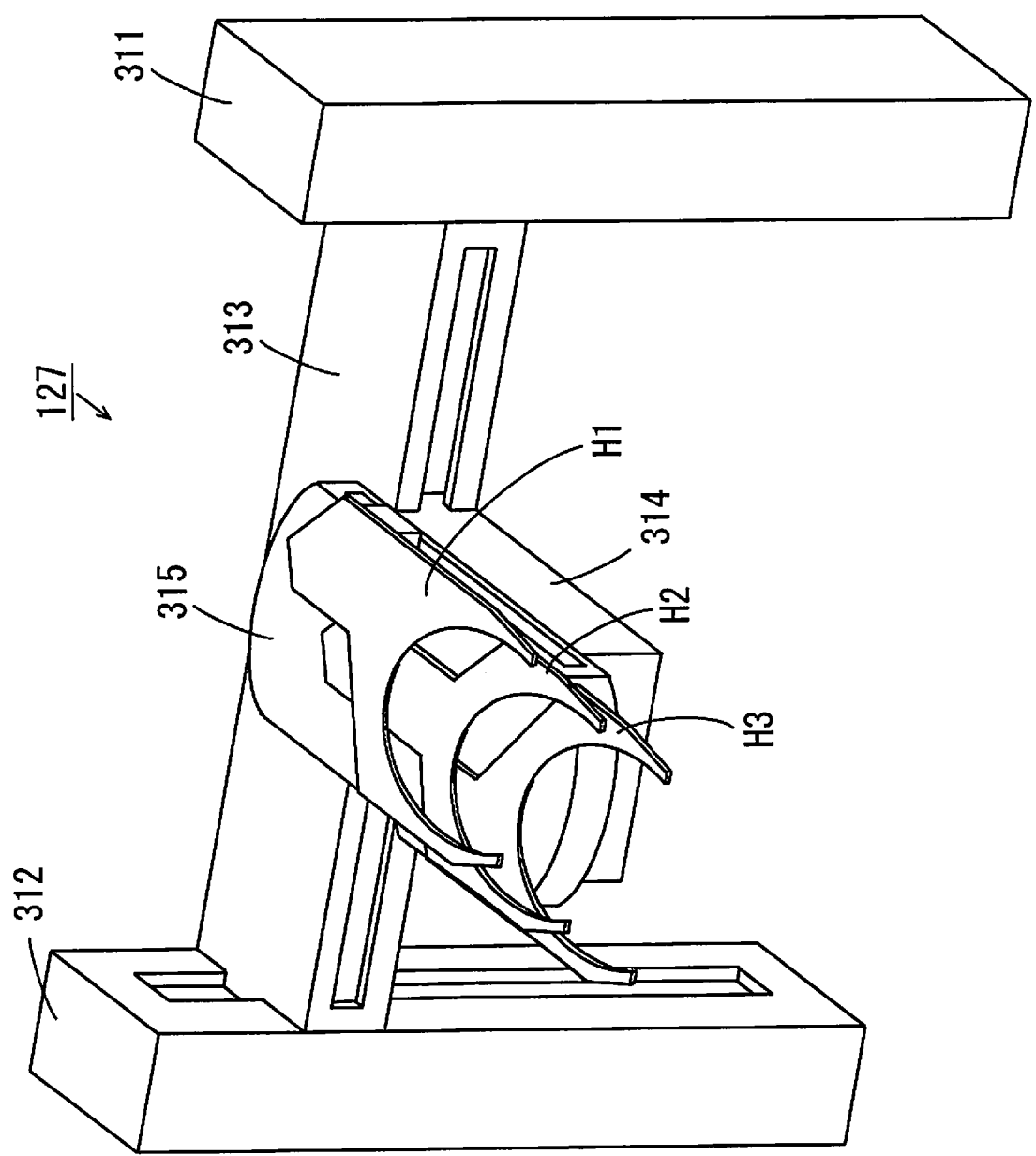
FIG. 10 is a perspective view showing a transport mechanism.

Next, the transport mechanism 127 will be described. FIG. 10 is a perspective view showing the transport mechanism 127. As shown in FIGS. 9 and 10, the transport mechanism 127 includes elongated guide rails 311, 312. As shown in FIG. 9, the guide rail 311 is fixed to the side surface close to the transport section 112 to extend in the vertical direction in the upper transport chamber 125. The guide rail 312 is fixed to the side surface close to the upper transport chamber 135 to extend in the vertical direction in the upper transport chamber 125.

An elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotation member 315 is rotatably provided on an upper surface of the moving member 314. Hands H1, H2, H3 for holding outer peripheries of substrates W are attached to the rotation member 315. The hands H1 to H3 are provided to be movable in a longitudinal direction of the rotation member 315. The hand H1 is arranged at a position farther upward than the hand H2, and the hand H2 is arranged at a position farther upward than the hand H3.

The above-mentioned configuration enables the transport mechanism 127 to move in the X and Z directions in the upper transport chamber 125. The transport mechanism 127 can receive the substrates W from and transfer the substrates W to the coating processing chambers 21, 22 (FIG. 2), the substrate platforms PASS1, PASS2, PASS5, PASS6 (FIG. 9) and the upper thermal processing section 301 (FIG. 6) using the hands H1 to H3.

As shown in FIG. 9, the transport mechanisms 128, 137, 138 have the configuration similar to that of the transport mechanism 127. Further, in the present embodiment, the transport mechanism 142 of FIG. 1 has the three hands H1 to H3 similar to those of the transport mechanism 127.

The transport mechanisms 127, 128, 137, 138 can selectively use the hands H1 to H3. For example, different hands can be used for transporting the substrate W before processing by one of metal removal units MR and transporting the substrate after the processing by the metal removal unit MR. Further, a plurality of substrates W can be simultaneously transported with use of the three hands H1 to H3. The number of hands of each transport mechanism is not limited to three, but may be four or more, or two or less.

(6) Substrate Processing

The substrate processing will be described with reference to FIGS. 1, 2, 6 and 9. Each carrier 113 in which unprocessed substrates W are stored is placed on each carrier platform 111 (FIG. 1) in the indexer block 11. The transport mechanism 115 transports an unprocessed substrate W from one of the carriers 113 to one of the substrate platforms PASS1, PASS3 (FIG. 9). Further, the transport mechanism 115 transports the processed substrate W that is placed on one of the substrate platforms PASS2, PASS4 (FIG. 9) to one of the carriers 113.

In the first processing block 12, the transport mechanism 127 (FIG. 9) sequentially transports an unprocessed substrate W that is placed on the substrate platform PASS1 to one of the adhesion reinforcement processing units PAHP (FIG. 6), one of the cooling units CP (FIG. 6) and the coating processing chamber 22 (FIG. 2). Next, the transport mechanism 127 sequentially transports the substrate W in the coating processing chamber 22 to one of the thermal processing units PHP (FIG. 6), one of the cooling units CP (FIG. 6), the coating processing chamber 21 (FIG. 2), one of the thermal processing units PHP (FIG. 6) and the substrate platform PASS5 (FIG. 9).

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, in the coating processing chamber 22, an anti-reflection film is formed on the substrate W by the anti-reflection film coating processing unit 129b (FIG. 2). Subsequently, the thermal processing is performed on the substrate Win the thermal processing unit PHP, and then the substrate W is cooled in the cooling unit CP to a temperature suitable for the formation of the resist film. Then, the resist film is formed on the substrate W by one of the resist film coating processing units 129a (FIG. 2) in the coating processing chamber 21. Thereafter, the thermal processing is performed on the substrate W in the thermal processing unit PHP, and the substrate W is placed on the substrate platform PASS5.

Further, the transport mechanism 127 transports the substrate W which is placed on the substrate platform PASS6 (FIG. 9) after the normal development processing to the substrate platform PASS2 (FIG. 9).

The transport mechanism 128 (FIG. 9) sequentially transports an unprocessed substrate W that is placed on the substrate platform PASS3 to one of the adhesion reinforcement processing units PAHP (FIG. 6), one of the cooling units CP (FIG. 6) and the coating processing chamber 24 (FIG. 2). Next, the transport mechanism 128 sequentially transports the substrate W in the coating processing chamber 24 to one of the thermal processing units PHP (FIG. 6), one of the cooling units CP (FIG. 6), the coating processing chamber 23 (FIG. 2), one of the thermal processing units PHP (FIG. 6) and the substrate platform PASS7 (FIG. 9).

Further, the transport mechanism 128 (FIG. 9) transports the substrate W which is placed on the substrate platform PASS8 (FIG. 9) after the normal development processing to the substrate platform PASS4 (FIG. 9). The contents of processing for the substrate W in the coating processing chambers 23, 24 (FIG. 2) and the lower thermal processing section 302 (FIG. 6) are respectively similar to the contents of processing for the substrate W in the above-mentioned coating processing chambers 21, 22 (FIG. 2) and the upper thermal processing section 301 (FIG. 6).

In the second processing block 13, the transport mechanism 137 (FIG. 9) transports the substrate W which is placed on the substrate platform PASS5 after formation of the resist film to the placement buffer unit P-BF1 (FIG. 9).

Further, the transport mechanism 137 (FIG. 9) takes out the substrate W after the normal exposure processing and before the thermal processing from the thermal processing unit PHP (FIG. 6) adjacent to the cleaning drying processing block 14A. The transport mechanism 137 sequentially transports the substrate W to one of the cooling units CP (FIG. 6), one of the development processing chambers 31, 32 (FIG. 6), one of the thermal processing units PHP (FIG. 6) and the substrate platform PASS6 (FIG. 9).

In this case, the substrate W is cooled in the cooling unit CP to a temperature suitable for the normal development processing, and then the normal development processing is performed on the substrate W by one of the development processing units 139 in one of the development processing chambers 31, 32. Thereafter, the thermal processing is performed on the substrate W in the thermal processing unit PHP, and the substrate W is placed on the substrate platform PASS6.

The transport mechanism 138 (FIG. 9) transports the substrate W which is placed on the substrate platform PASS7 after formation of the resist film to the placement buffer unit P-BF2 (FIG. 9).

Further, the transport mechanism 138 (FIG. 9) takes out the substrate W after the normal exposure processing and after the thermal processing from one of the thermal processing units PHP (FIG. 6) adjacent to the interface block 14. The transport mechanism 138 sequentially transports the substrate W to one of the cooling units CP (FIG. 6), one of the development processing chambers 33, 34 (FIG. 2), one of the thermal processing units PHP (FIG. 6) and the substrate platform PASS8 (FIG. 9). The contents of processing for the substrate W in the development processing chambers 33, 34 and the lower thermal processing section 304 are respectively similar to the contents of processing for the substrate W in the above-mentioned development processing chambers 31, 32 and the upper thermal processing section 303.

In the cleaning drying processing block 14A, the transport mechanism 142 (FIG. 1) transports the substrate W that is placed on one of the placement buffer units P-BF1, P-BF2 (FIG. 9) to one of the metal removal units MR (FIG. 6). Further, the transport mechanism 142 transports the substrate W in the metal removal unit MR to the placement buffer unit P-BF1 (FIG. 9) or the placement buffer unit P-BF2 (FIG. 9). The transport mechanism 141 (FIG. 1) sequentially transports the substrate W that has been transported from the metal removal unit MR to the placement buffer unit P-BF1, P-BF2 to one of the cleaning drying processing units BSS (FIG. 2) and one of the placement cooling units P-CP (FIG. 9).

In this case, in the metal removal unit MR, the metallic component remaining on the peripheral portion and the back surface of the substrate W is removed. Further, in the cleaning drying processing unit BSS, the peripheral portion and the back surface of the substrate W are cleaned and dried. Subsequently, the substrate W is cooled in the placement cooling unit P-CP to a temperature suitable for the normal exposure processing by the exposure device 15 (FIG. 1).

The transport mechanism 142 (FIG. 1) transports the substrate W which is placed on the substrate platform PASS9 (FIG. 9) after the normal exposure processing to one of the thermal processing units PHP (FIG. 6) in the upper thermal processing section 303 or the lower thermal processing section 304. In this case, post-exposure bake (PEB) processing is performed in the thermal processing unit PHP.

In the carry-in carry-out block 14B, the transport mechanism 146 (FIG. 1) transports the substrate W which is placed on a placement cooling unit P-CP (FIG. 6) before the normal exposure processing to a substrate inlet of the exposure device 15 (FIG. 1). Further, the transport mechanism 146 takes out the substrate W after the normal exposure processing from a substrate outlet of the exposure device 15, and transports the substrate W to the substrate platform PASS9 (FIG. 9). In the exposure device 15, the normal exposure processing is performed on the substrate W with use of EUV having a significantly short wavelength. In this case, because a metallic component is contained in a resist film on the substrate W, the EUV light is efficiently absorbed. Thus, a fine exposure pattern can be formed in the resist film at high resolution. The exposure method is not limited to this, and the normal exposure processing may be performed on the substrate W with use of another method.

In the present embodiment, processing on the substrates W in the coating processing chambers 21, 22, the development processing chambers 31, 32 and the upper thermal processing sections 301, 303 that are provided in the upper stage, and processing on the substrates W in the coating processing chambers 23, 24, the development processing chambers 33, 34 and the lower thermal processing sections 302, 304 that are provided in the lower stage can be performed in parallel with each other. Thus, it is possible to improve the throughput without increasing the footprint.

(7) Effects

In the substrate processing apparatus 100 according to the present embodiment, the edge exposure processing and the edge development processing are performed on the resist film on the substrate W after the resist film is formed on the substrate W and before the substrate W is transported to the exposure device 15. Thus, the resist film can be appropriately removed from the peripheral portion of the substrate W. Therefore, the metallic component is prevented from remaining on the peripheral portion of the substrate W. As a result, the metallic contamination of the substrate processing apparatus 100 and the exposure device 15 caused by the metallic component remaining on the peripheral portion of the substrate W can be sufficiently prevented.

Further, in the present embodiment, in each resist film coating processing unit 129a, the application of the resist liquid by the coating liquid nozzle 28, the edge exposure processing performed by the edge exposure unit 41, the edge heating processing performed by the heater 42 and the edge development processing performed by the development liquid nozzle 43 are sequentially carried out while the substrate W is rotated by the spin chuck 25. Thus, the resist film can be formed, and the edge exposure processing, the edge heating processing and the edge development processing can be performed, in the common space. Therefore, an increase in cost of the apparatus and an increase in size of the substrate processing apparatus 100 can be suppressed.

[2] Second Embodiment

Figure 11:
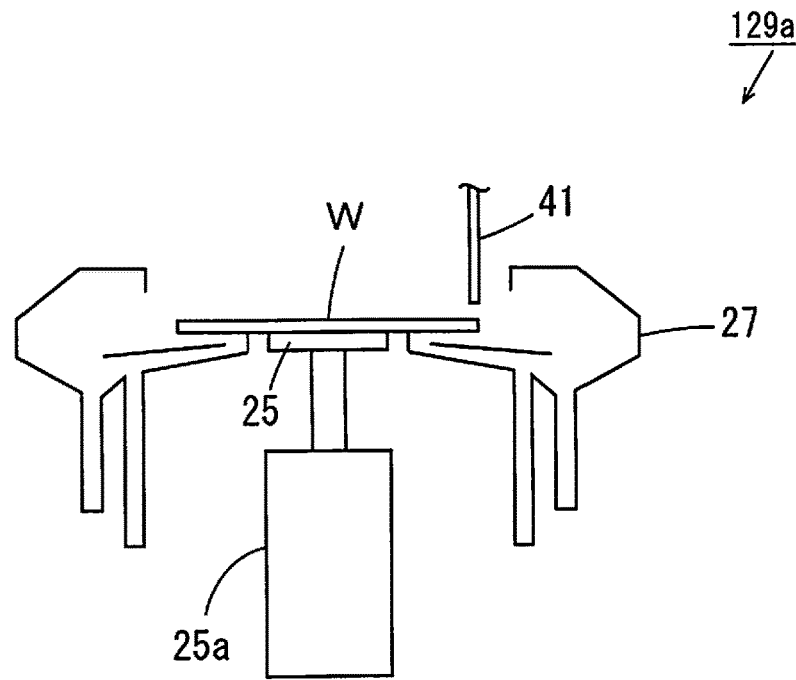
FIG. 11 is a schematic diagram for explaining a configuration of a resist film coating processing unit in a second embodiment.

As for a second embodiment of the present invention, a difference from the above-mentioned first embodiment will be described. FIG. 11 is a schematic diagram for explaining a configuration of a resist film coating processing unit 129a in the second embodiment. The resist film coating processing unit 129a of FIG. 11 is different from the resist film coating processing unit 129a of FIG. 3 in that the heater 42 and the development liquid nozzle 43 are not provided. Thus, in the resist film coating processing unit 129a of FIG. 11, the edge heating processing and the edge development processing are not performed after the edge exposure processing.

Similarly to the first embodiment, the transport mechanism 127 of FIG. 9 sequentially transports the substrate W after the edge exposure processing in the coating processing chamber 21 to a thermal processing unit PHP (FIG. 6) and the substrate platform PASS5 (FIG. 9). Further, the transport mechanism 128 of FIG. 9 sequentially transports the substrate W after the edge exposure processing in the coating processing chamber 23 to a thermal processing unit PHP (FIG. 6) and the substrate platform PASS7 (FIG. 9). In this case, the entire substrate W is heated in each thermal processing unit PHP. Therefore, similarly to the above-mentioned edge heating processing, heating processing is performed on the part of a resist film on the peripheral portion of the substrate W.

The transport mechanism 137 of FIG. 9 transports the substrate W that is placed on the substrate platform PASS5 after the thermal processing to any one of the development processing chambers 31, 32. Further, the transport mechanism 138 of FIG. 9 transports the substrate W that is placed on the substrate platform PASS7 after the thermal processing to any one of the development processing chambers 33, 34. In each of the development processing chambers 31 to 34, the development liquid is supplied to the peripheral portion of the thermally processed substrate W. Thus, the edge development processing is performed on the substrate W. In this case, the development liquid may be supplied only to the peripheral portion of the substrate W from each slit nozzle 38 of FIG. 1. Alternatively, another nozzle arranged to be directed to the peripheral portion of the substrate W similarly to each development liquid nozzle 43 of FIG. 3 may be provided separately.

The transport mechanism 137 of FIG. 9 transports the substrate W after the edge development processing from any one of the development processing chambers 31, 32 to the placement buffer unit P-BF1 (FIG. 9). Further, the transport mechanism 138 of FIG. 9 transports the substrate W after the edge development processing from one of the development processing chambers 33, 34 to the placement buffer unit P-BF2 (FIG. 9). Thereafter, similarly to the above-mentioned embodiment, the substrates W are transported to the exposure device 15 (FIG. 1), and the normal exposure processing is performed on the substrates W.

In this manner, in the second embodiment, when the heating processing is performed on the substrate W in a thermal processing unit PHP, the part of the resist film on the peripheral portion of the substrate W after the edge exposure processing is also heated. Thus, it is possible to appropriately perform the subsequent edge development processing without performing the edge heating processing separately. Therefore, as compared to the case where the edge heating processing is performed separately, a time period required to process the substrate W can be reduced. Further, it is not necessary to provide the heater 42 of FIG. 4. Therefore, the cost of the apparatus can be lowered, and it is not necessary to ensure a space in which the heater 42 is provided.

Further, in the present embodiment, the edge development processing and the normal development processing are respectively performed on the substrate W in the common development processing unit 139. Thus, it is not necessary to provide the development liquid nozzle 43 of FIG. 4. Therefore, the cost of the apparatus can be lowered, and it is not necessary to secure a space in which the development liquid nozzle 43 is provided.

[3] Other Embodiments (1) While the metal removal units MR for supplying the metal removal liquid to the peripheral portions of the substrates W are provided in the interface block 14 in the above-mentioned embodiments, the present invention is not limited to this. For example, a nozzle that can discharge the metal removal liquid to the peripheral portion of a substrate W may be provided in the resist film coating processing unit 129a. Further, when the metallic component on the peripheral portion of the substrate W can be sufficiently removed by the edge development processing, the metal removal units MR do not have to be provided.

(2) While the edge heating processing is performed on the substrate W after the edge exposure processing and before the edge development processing in the above-mentioned embodiments, the present invention is not limited to this. It is possible to appropriately perform the edge development processing without performing the edge heating processing after the edge exposure processing depending on the type of a photosensitive material included in a resist film.

(3) While the edge exposure processing is performed on the substrate W in each resist film coating processing unit 129a in the above-mentioned embodiments, the present invention is not limited to this. A unit that performs the edge exposure processing on a substrate W after formation of a resist film may be provided separately from the resist film coating processing units 129a.

(4) While the edge development processing is performed on the substrate W in each resist film coating processing unit 129a or each development processing unit 139 in the above-mentioned embodiments, the present invention is not limited to this. A unit that performs the edge development processing on the substrate W after the edge exposure processing may be provided separately from the resist film coating processing units 129a and the development processing units 139.

Figure 12:
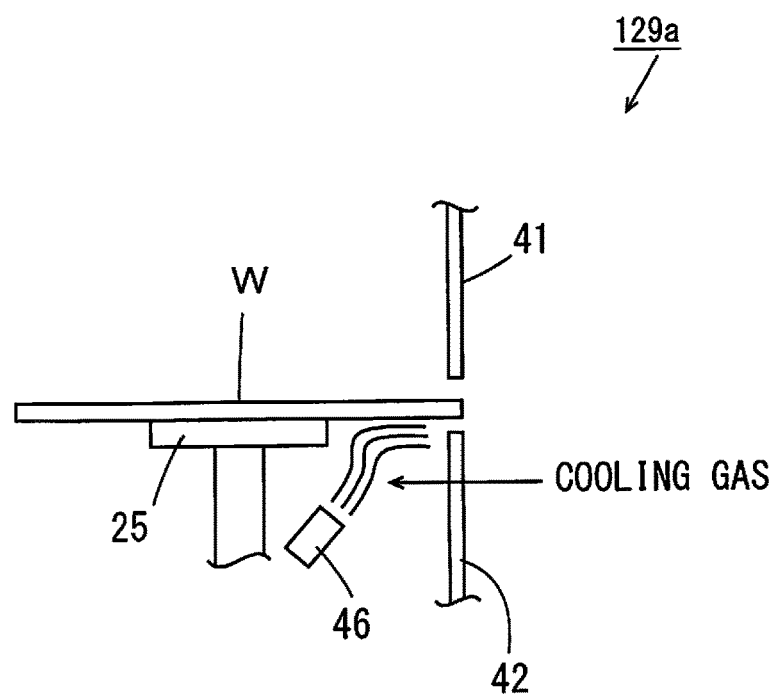
FIG. 12 is a diagram showing one example of a cooling gas supplier.

(5) In the above-mentioned first embodiment, the peripheral portion of the substrate W is heated by the heater 42 during the edge heating processing. In this case, when heat is non-uniformly applied to the part of the resist film on which the normal exposure processing is to be performed, the accuracy of processing of the substrate W is degraded. As such, a cooling gas supplier that supplies gas for cooling to the part other than the peripheral portion of the substrate W may be provided. FIG. 12 is a diagram showing one example of the cooling gas supplier. In the example of FIG. 12, the cooling gas supplier 46 is provided below the substrate W held by a spin chuck 25. The cooling gas supplier 46 supplies the gas for cooling to the back surface of the substrate W held by the spin chuck 25. Thus, an increase in temperature of the part of the resist film on which the normal exposure processing is to be performed is suppressed, and uniformity of the thermal processing performed on the part of the resist film is improved. Thus, the accuracy of processing of the substrate W can be enhanced.

(6) While the two spin chucks 25 are provided in each of the coating processing chambers 21 to 24, and three spin chucks 35 are provided in each of the development processing chambers 31 to 34 in the above-mentioned embodiments, the present invention is not limited to this. One spin chuck, or three or more than three spin chucks 25 may be provided in each of the coating processing chambers 21 to 24. Further, two or less than two spin chucks 35, or four or more than four spin chucks 35 may be provided in each of the development processing chambers 31 to 34.

(7) While each hand H1 to H3 of each of the transport mechanisms 127, 128, 137, 138, 141 holds the outer periphery of the substrate W in the above-mentioned embodiments, the present invention is not limited to this. Each hand H1 to H3 of each of the transport mechanisms 127, 128, 137, 138, 141 may hold the back surface of the substrate W by sucking the substrate W.

[4] Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiments, the substrate processing apparatus 100 is an example of a substrate processing apparatus, the substrate W is an example of a substrate, the exposure device 15 is an example of an exposure device, the resist film coating processing units 129a are an example of a film formation unit, the resist film is an example of a metal-containing photosensitive film, the edge exposure units 41 are an example of an edge exposer, the development liquid nozzles 43 are an example of an edge development processor, the transport mechanism 146 is an example of a transport mechanism, and the development processing units 139 are an example of a development processing unit.

Further, the spin chucks 25 are an example of a rotation holder, the coating liquid nozzles 28 are an example of a liquid supplier, the edge rinse nozzles 44 are an example of a first removal liquid supplier, the heaters 42 are an example of a heater, the slit nozzles 38 are an example of a development liquid nozzle, the thermal processing units PHP are an example of a thermal processing unit, and the peripheral portion cleaning nozzles 8 are an example of a second removal liquid supplier.

As each of constituent elements recited in the claims, various other elements having configurations or functions described in the claims can be also used.

INDUSTRIAL APPLICABILITY

The present invention can be effectively utilized for processing various types of substrates.

The invention claimed is:

1. A substrate processing apparatus arranged to be adjacent to an exposure device that performs exposure processing on a substrate, comprising:
   a film formation unit that forms a metal-containing photosensitive film including a metallic component and a photosensitive material on a surface to be processed of the substrate;
   an edge exposer that irradiates a peripheral portion of the substrate after formation of the metal-containing photosensitive film with light;
   an edge development processor that performs development processing on a part of the metal-containing photosensitive film that has been irradiated with light by the edge exposer by supplying a development liquid to the peripheral portion of the substrate;
   a transport mechanism that transports the substrate after the development processing by the edge development processor to the exposure device; and
   a development processing unit that performs development processing on the metal-containing photosensitive film by supplying a development liquid to the substrate after the exposure processing in the exposure device,
   wherein the edge development processor performs the development processing on the part of the metal-containing photosensitive film that has been irradiated with light by the edge exposer after the irradiation of the peripheral portion of the substrate with light by the edge exposer and before the exposure processing in the exposer.

2. The substrate processing apparatus according to claim 1, wherein
   the film formation unit includes
   a rotation holder that holds and rotates the substrate, and
   a liquid supplier that supplies a coating liquid for the metal-containing photosensitive film to the surface to be processed of the substrate rotated by the rotation holder, and
   the edge exposer is configured to irradiate the peripheral portion of the substrate rotated by the rotation holder with light after supply of the coating liquid by the liquid supplier.

3. The substrate processing apparatus according to claim 2, wherein
the film formation unit further includes a first removal liquid supplier that supplies a first removal liquid for dissolving the coating liquid to the peripheral portion of the substrate rotated by the rotation holder after supply of the coating liquid by the liquid supplier.

4. The substrate processing apparatus according to claim 2, wherein
the edge development processor is configured to discharge the development liquid to the peripheral portion of the substrate that is rotated by the rotation holder after irradiation with light by the edge exposer.

5. The substrate processing apparatus according to claim 2, further comprising a heater configured to heat the peripheral portion of the substrate rotated by the rotation holder after irradiation with light by the edge exposer and before the development processing by the edge development processor.

6. The substrate processing apparatus according to claim 1, wherein
the edge development processor is provided in the development processing unit.

7. The substrate processing apparatus according to claim 6, wherein
the edge development processor and the development processing unit have a common development liquid nozzle that can discharge the development liquid.

8. The substrate processing apparatus according to claim 1, further comprising a thermal processing unit that performs heating processing on the substrate after irradiation with light by the edge exposer and before development by the edge development processor.

9. The substrate processing apparatus according to claim 1, further comprising a second removal liquid supplier that supplies a second removal liquid for dissolving a metallic component to the peripheral portion of the substrate after the development processing by the edge development processor.

10. A substrate processing method comprising:
forming a metal-containing photosensitive film including a metallic component and a photosensitive material on a surface to be processed of a substrate by a film formation unit;
irradiating a peripheral portion of the substrate after formation of the metal-containing photosensitive film with light by an edge exposer;
performing development processing on a part of the metal-containing photosensitive film that has been irradiated with light by the edge exposer by supplying a development liquid to the peripheral portion of the substrate by an edge development processor;
transporting the substrate after the development processing by the edge development processor to an exposure device; and
performing development processing on the metal-containing photosensitive film by supplying a development liquid to the substrate in a development processing unit after exposure processing in the exposure device,
wherein the performing of the development processing on the part of the metal-containing photosensitive film that has been irradiated with light by the edge exposer includes performing the development processing on the part of the metal-containing photosensitive film that has been irradiated with light by the edge exposer after the irradiation of the peripheral portion of the substrate with light by the edge exposer and before the exposure processing in the exposer.

11. The substrate processing method according to claim 10, wherein
the forming of the metal-containing photosensitive film includes supplying a coating liquid for the metal-containing photosensitive film by a liquid supplier to the surface to be processed of the substrate rotated by a rotation holder, and
the irradiating of the peripheral portion of the substrate with light includes irradiating the peripheral portion of the substrate rotated by the rotation holder with light by the edge exposer after supply of the coating liquid by the liquid supplier.

12. The substrate processing method according to claim 11, further including supplying a first removal liquid for dissolving the coating liquid by a first removal liquid supplier in the film formation unit to the peripheral portion of the substrate rotated by the rotation holder after supply of the coating liquid by the liquid supplier.

13. The substrate processing method according to claim 11, wherein the performing development processing on the part of the metal-containing photosensitive film includes discharging the development liquid to the peripheral portion of the substrate rotated by the rotation holder after irradiation with light by the edge exposer.

14. The substrate processing method according to claim 11, further including heating the peripheral portion of the substrate rotated by the rotation holder after irradiation with light by the edge exposer and before the development processing by the edge development processor.

15. The substrate processing method according to claim 10, wherein
the edge development processor is provided in the development processing unit, and
the performing development processing on the part of the metal-containing photosensitive film includes supplying the development liquid to the peripheral portion of the substrate by the edge development processor that is provided in the development processing unit.

16. The substrate processing method according to claim 15, wherein
the edge development processor and the development processing unit have a common development liquid nozzle that can discharge the development liquid,
the performing development processing on the part of the metal-containing photosensitive film includes supplying the development liquid to the peripheral portion of the substrate by the common development liquid nozzle, and
the performing development processing on the metal-containing photosensitive film includes supplying the development liquid to the substrate by the common development liquid nozzle after the exposure processing by the exposure device.

17. The substrate processing method according to claim 10, further including performing heating processing on the substrate by a thermal processing unit after irradiation with light by the edge exposer and before the development processing by the edge development processor.

18. The substrate processing method according to claim 10, further including supplying a second removal liquid for dissolving a metallic component to the peripheral portion of the substrate by a second removal liquid supplier after the development processing by the edge development processor.

* * * * *